(12) United States Patent
Patti

(10) Patent No.: US 11,552,189 B2
(45) Date of Patent: Jan. 10, 2023

(54) HIGH ELECTRON MOBILITY TRANSISTOR (HEMT) DEVICES AND METHODS

(71) Applicant: STMicroelectronics S.r.l., Agrate Brianza (IT)

(72) Inventor: Davide Giuseppe Patti, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 106 days.

(21) Appl. No.: 17/027,118

(22) Filed: Sep. 21, 2020

(65) Prior Publication Data

US 2021/0091219 A1  Mar. 25, 2021

Related U.S. Application Data

(60) Provisional application No. 62/905,625, filed on Sep. 25, 2019.

(51) Int. Cl.
| | |
|---|---|
| *H01L 29/778* | (2006.01) |
| *H01L 29/66* | (2006.01) |
| *H01L 29/04* | (2006.01) |
| *H01L 29/423* | (2006.01) |
| *H01L 21/02* | (2006.01) |

(Continued)

(52) U.S. Cl.
CPC ........ *H01L 29/7788* (2013.01); *H01L 29/045* (2013.01); *H01L 29/42316* (2013.01); *H01L 29/66462* (2013.01); *H01L 29/7786* (2013.01); *H01L 29/7789* (2013.01); *H01L 21/0254* (2013.01); *H01L 21/02428* (2013.01); *H01L 21/02433* (2013.01); *H01L 21/02458* (2013.01); *H01L 27/0605* (2013.01); *H01L 29/2003* (2013.01); *H01L 29/205* (2013.01); *H01L 29/432* (2013.01)

(58) Field of Classification Search
None
See application file for complete search history.

(56) References Cited

U.S. PATENT DOCUMENTS

| | | | |
|---|---|---|---|
| 10,283,501 B2 | 5/2019 | Macelwee et al. | |
| 2006/0057790 A1* | 3/2006 | Clarke | H01L 29/7787 |
| | | | 257/E29.253 |

(Continued)

FOREIGN PATENT DOCUMENTS

| | | |
|---|---|---|
| CN | 102629624 A | 8/2012 |
| CN | 106549038 A | 3/2017 |

(Continued)

*Primary Examiner* — Khaja Ahmad
(74) *Attorney, Agent, or Firm* — Seed IP Law Group LLP

(57) ABSTRACT

Embodiments are directed to high electron mobility transistor (HEMT) devices and methods. One such HEMT device includes a substrate having a first surface, and first and second heterostructures on the substrate and facing each other. Each of the first and second heterostructures includes a first semiconductor layer on the first surface of the substrate, a second semiconductor layer on the first surface of the substrate, and a two-dimensional electrode gas (2DEG) layer between the first and second semiconductor layers. A doped semiconductor layer is disposed between the first and second heterostructures, and a source contact is disposed on the first heterostructure and the second heterostructure.

19 Claims, 15 Drawing Sheets

(51) Int. Cl.
    *H01L 29/20*      (2006.01)
    *H01L 29/205*     (2006.01)
    *H01L 27/06*      (2006.01)
    *H01L 29/43*      (2006.01)

(56) References Cited

U.S. PATENT DOCUMENTS

| | | | | |
|---|---|---|---|---|
| 2011/0156050 A1* | 6/2011 | Okada | ............... | H01L 29/66462 |
| | | | | 438/585 |
| 2013/0248876 A1* | 9/2013 | Yaegashi | ........... | H01L 29/41741 |
| | | | | 438/268 |
| 2014/0175454 A1* | 6/2014 | Roberts | ................ | H03K 17/687 |
| | | | | 257/76 |
| 2015/0333164 A1* | 11/2015 | Imada | ................... | H03F 1/3247 |
| | | | | 257/194 |
| 2015/0349097 A1* | 12/2015 | Konrath | ............ | H01L 29/66848 |
| | | | | 438/192 |
| 2017/0125574 A1* | 5/2017 | Chowdhury | ........ | H01L 29/7787 |

FOREIGN PATENT DOCUMENTS

| | | |
|---|---|---|
| CN | 108511513 A | 9/2018 |
| JP | 4812292 B2 | 11/2011 |

\* cited by examiner

HIGH ELECTRON MOBILITY TRANSISTOR (HEMT) DEVICES AND METHODS

BACKGROUND

Technical Field

The present disclosure generally relates to high electron mobility transistor devices and methods, and more specifically to high electron mobility transistors having vertically oriented heterostructures.

Description of the Related Art

A high electron mobility transistor (HEMT) is a type of field effect transistor (FET) in which an electron current flows freely within a conduction channel in a semiconductor. Such a substantially unobstructed conduction channel forms in a two-dimensional electron gas (2DEG) layer adjacent to a heterojunction, i.e., a boundary between two different semiconductors.

In conventional HEMTs, a heterostructure which facilitates formation of the 2DEG layer is formed as a planar stack of semiconductor materials, for example, with a first semiconductor layer on a substrate, and a second semiconductor layer on the first semiconductor layer. Conventional HEMTs, and in particular conventional gallium nitride (GaN) HEMTs, are formed on different silicon substrates as other circuitry (such as CMOS circuitry) that is electrically coupled to the HEMTs, such as CMOS driving or logic circuitry. That is, conventional HEMTs generally cannot be monolithically integrated with CMOS circuitry on a same semiconductor substrate or die. As such, the CMOS circuitry is typically formed on a separate substrate or die as the HEMTs, and the two separate substrates or dies are electrically connected to one another using wires, solder bumps, or the like.

BRIEF SUMMARY

The present disclosure is generally directed to high mobility electron transistors (HEMTs), electronic devices including HEMTs, and methods of forming HEMTs, in which heterostructures are formed with a vertical orientation along sidewalls of trenches formed in a semiconductor material, such as epitaxial silicon.

The sidewalls of the trenches may be sidewalls of the epitaxial silicon and may be formed to have a <111> crystal orientation, which facilitates formation of HEMTs in the silicon substrate. This allows for HEMT devices to be formed on a same die (e.g., a silicon die) as other circuitry, including, for example, CMOS transistors, or the like. This provides significant advantages over prior approaches, since the HEMT devices and driving circuitry, logic circuitry, or other circuitry which may be formed by CMOS processes may be integrated into a same silicon die, thereby providing space savings as compared to devices in which two separate dies are utilized to form the HEMT devices and the CMOS devices. Moreover, improvements are provided by embodiments of the present disclosure in the way of increased speed and reduced stray inductance, since wiring or solder bumps between separate dies may be avoided.

In one or more embodiments, the present disclosure provides a high electron mobility transistor (HEMT) that includes a substrate having a first surface. A first heterostructure and a second heterostructure are disposed on the substrate and the first and second heterostructures face each another. Each of the first and second heterostructures includes a first semiconductor layer on the first surface of the substrate, a second semiconductor layer on the first surface of the substrate, and a two-dimensional electrode gas (2DEG) layer between the first and second semiconductor layers. A doped semiconductor layer is disposed between the first and second heterostructures, and a source contact is provided on the first heterostructure and the second heterostructure.

In one or more embodiments, the present disclosure provides an electronic device that includes a silicon substrate having a first surface, a high electron mobility transistor (HEMT) on the silicon substrate, and driving circuitry on the silicon substrate and electrically coupled to the HEMT. The HEMT includes first and second heterostructures, a doped semiconductor layer between the first and second heterostructures, a source contact on the first and second heterostructures, and a gate contact on the doped semiconductor layer. Each of the first and second heterostructures includes a first semiconductor layer on a first surface of the substrate, a second semiconductor layer on the first surface of the substrate, and a two-dimensional electrode gas (2DEG) layer between the first and second semiconductor layers.

In one or more embodiments, the present disclosure provides a method of forming a high electron mobility transistor (HEMT) that includes: forming first and second heterostructures on a first surface of a substrate, each of the first and second heterostructures including a first semiconductor layer on the first surface of the substrate, a second semiconductor layer on the first surface of the substrate, and a two-dimensional electrode gas (2DEG) layer between the first and second semiconductor layers; forming a doped semiconductor layer between the first and second heterostructures; forming a source contact on the first and second heterostructures; forming a gate contact on the doped semiconductor layer; and forming a drain contact on a second surface of the silicon substrate opposite the first surface.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

Figure 1A:
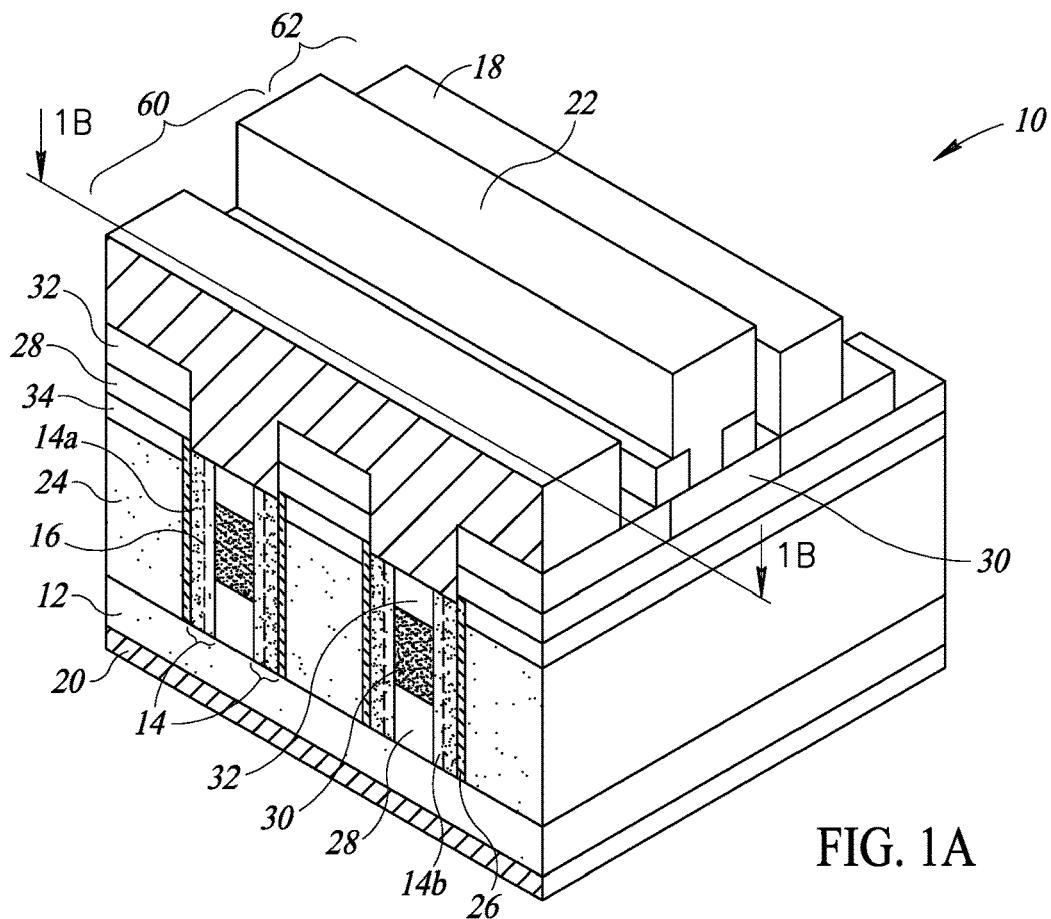
FIG. 1A is a top plan view illustrating a two-dimensional electron gas (2DEG)-confined device, which may be a high electron mobility transistor (HEMT) device, in accordance with one or more embodiments of the present disclosure.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with high electron mobility transistors (HEMTs) have not been shown or described in detail to avoid unnecessarily obscuring descriptions of the various embodiments provided herein.

Unless the context requires otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the Disclosure provided herein are for convenience only and do not interpret the scope or meaning of the embodiments.

Reference throughout the specification to conventional deposition techniques for depositing metals, semiconductor layers, dielectric materials, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. Furthermore, reference to conventional techniques of formation of various layers by deposition may include growing a film or layer in-situ.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of metals, photoresist, dielectric materials, semiconductor layers, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain etching techniques should not be limited to those described. In some instances, two such techniques may be interchangeable.

Figure 1B:
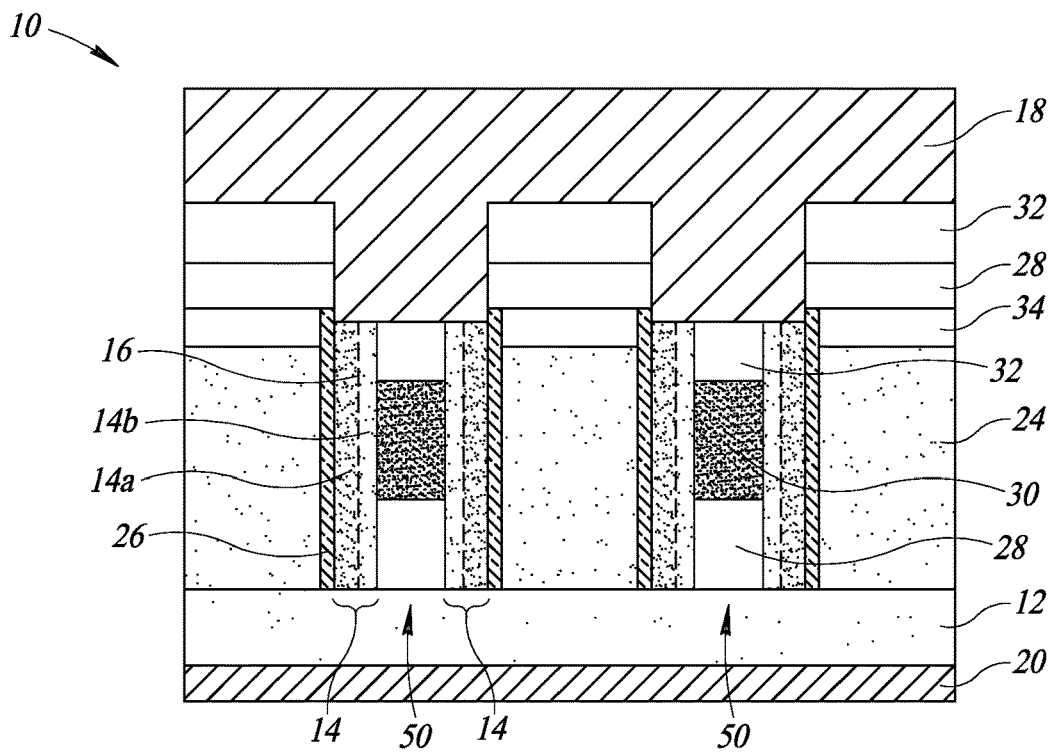
FIG. 1B is a cross-sectional view of the HEMT device shown in FIG. 1A, in accordance with one or more embodiments of the present disclosure.

FIG. 1A is a perspective view illustrating a high electronic mobility transistor (HEMT) device 10, and FIG. 1B is a cross-sectional view of the HEMT device 10 taken along the line 1B-1B, in accordance with one or more embodiments of the present disclosure.

The HEMT device 10 includes a substrate 12 and a heterostructure 14 on the substrate 12. As shown in FIG. 1A, multiple heterostructures may be provided on the substrate 12, and corresponding pairs of the heterostructures 14 may be facing each other, and each of the heterostructures 14 may have a length that extends in a direction transverse to a surface of the substrate 12. For example, the substrate 12 may have a surface (e.g., an upper surface) that extends in a first direction (e.g., the horizontal direction as shown in FIG. 1A), and each of the heterostructures 14 may have a length or a long-axis that extends in a second direction (e.g., the vertical direction as shown) which is transverse to the first direction. In some embodiments, the heterostructures 14 may be vertical structures, for example, which extend in the vertical direction with respect to the horizontal upper surface of the substrate 12.

In some embodiments, the substrate 12 may be a silicon (Si) substrate, although embodiments of the present disclosure are not limited thereto, and in various embodiments, the substrate 12 may be any suitable substrate.

The heterostructures 14 may each include a stack of materials which may form a uniform two-dimensional electron gas (2DEG) layer 16 therein. A two-layered heterostructure 14 including two different semiconductor materials, e.g., a first layer 14a and a second layer 14b, is shown in FIG. 1A and described herein; however, embodiments of the present disclosure are not limited thereto. In various embodiments, the HEMT device 10 may include heterostructures having more than two layers, including, for example, structures wherein each of the first layer 14a and the second layer 14b may include one or more semiconductors or other materials.

The HEMT device 10 includes one or more source contacts 18, a drain contact 20, and a gate contact 22. In the HEMT device 10 shown in FIG. 1A, two HEMTs are included, namely, a first HEMT 60 and a second HEMT 62. Each of the first and second HEMTs 60, 62 are substantially the same in structure and in operation, and the first and second HEMTs 60, 62 may share the same gate contact 22, as shown. Accordingly, operation of the first and second HEMTs 60, 62 may be controlled by application of suitable voltages to the shared gate contact 22.

The gate contact 22 modulates electron mobility within a conduction channel of the HEMT device 10, e.g., application of a suitable voltage at the gate contact 22 modulates electron mobility within the heterostructures 14 by forming the 2DEG layer 16.

Formation of the 2DEG layer 16 at the heterojunction between the first and second layers 14a, 14b is related to energy levels within the heterostructure 14. In some embodiments, the semiconductor material in the second layer 14b of the heterostructure 14 is a doped semiconductor material having a wide energy band gap. In some embodiments, the second layer 14b may be or include a layer of aluminum gallium nitride (AlGaN), which in some embodiments may be negatively-doped (e.g., doped with n-type dopants).

The semiconductor material in the first layer 14a of the heterostructure 14 may be an un-doped or intrinsic semiconductor material having a narrow energy band gap. In some embodiments, the first layer 14a may be or include a layer of an intrinsic semiconductor, e.g., undoped gallium nitride (GaN).

The term "band gap" refers to the difference between the energy of conduction band electrons (free electrons) and the energy of valence band electrons (atomically bound electrons), i.e., the amount of energy needed to liberate valence electrons from atoms in the semiconductor crystal. Because the band gaps differ between the first and second layers 14a, 14b of the heterostructure 14, the conduction band energies of the materials do not coincide. Thus, when two such layers of semiconductor materials are placed in contact with one another, their energy levels are discontinuous at the boundary or heterojunction. Such a discontinuity gives rise to a potential well at the heterojunction which traps unbound donor electrons from the n-doped material (e.g., the second layer 14b) at the surface of the un-doped material (e.g., the first layer 14a), resulting in a peak electron concentration at the heterojunction. Such trapped donor electrons are sometimes referred to as a two-dimensional electron gas (2DEG). The location of the 2DEG layer 16 thus defines the conduction channels of the HEMT device 10.

Because the electrons in the conduction channel of the 2DEG layer 16 have little interaction with lattice, the mobility is high compared to the electron mobility in conventional transistor devices. The high electron mobility of the HEMT device 10 (e.g., of the first and second HEMTs 60, 62) allows a large electron current to flow within the conduction channel (i.e., the 2DEG layer 16), thereby increasing the speed of the device. A voltage applied to the gate contact 22 alters the conductivity within the conduction channel, thereby modulating the electron current between the source and drain contacts 18, 20. The ability to support such a high electron current makes HEMT devices suitable for high-power, high-frequency applications such as chips used in RF communication devices (e.g., cell phones, satellite TV receivers, radar equipment, and the like).

The HEMT device 10 may further include an epitaxial semiconductor layer 24, which may be considered as part of the substrate 12. For example, the substrate of the HEMT device 10 may include the substrate 12 as well as the epitaxial semiconductor layer 24. The epitaxial semiconductor layer 24 may be formed of a same semiconductor material as the substrate 12. For example, in some embodiments, the epitaxial semiconductor layer 24 may be a layer of epitaxial silicon that is formed on the substrate 12, and the substrate 12 may be a silicon substrate. In some embodiments, the substrate 12 may be a silicon substrate that is doped (e.g., n++ doping). In some embodiments, the substrate 12 may be a silicon substrate that has a crystal orientation that is different than a <111> orientation. For example, in some embodiments, the substrate 12 is a silicon substrate that has a <100> crystal orientation. In some embodiments, the substrate 12 is a silicon substrate that has a <110> crystal orientation A feed layer 26 is formed between side surfaces of the epitaxial semiconductor layer 24 and the first layer 14a of the heterostructures 14. The feed layer 26, in some embodiments, is used to facilitate formation of the first layer 14a of the heterostructure 14. In some embodiments, the feed layer 26 is a layer of aluminum nitride (AlN).

An oxide layer 34 may be provided on a surface of the epitaxial semiconductor layer 24 (e.g., on the upper surface thereof), and the feed layer 26 may be provided on side surfaces of the oxide layer 34, as shown in FIG. 1A. In some embodiments, the oxide layer may be used as a mask during a process of forming the HEMT device 10, as will be described in further detail later herein.

A first dielectric layer 28 may be provided on the oxide layer 34. In some embodiments, as shown in FIG. 1A, a portion of the first dielectric layer 28 may also be provided between the two heterostructures 14. For example, a portion of the first dielectric layer 28 may be provided on the substrate 12, as shown.

A doped semiconductor layer 30 is formed on the first dielectric layer 28 and extends between the two heterostructures 14, as shown in FIG. 1A. The doped semiconductor layer 30 may be, for example, a positively-doped semiconductor layer having p-type dopants. In some embodiments, the doped semiconductor layer 30 is a GaN layer that is doped with p-type dopants, such as magnesium (Mg). The doped semiconductor layer 30 contacts the gate contact 22, and the doped semiconductor layer 30 may operate as a gate region of the HEMT device 10, e.g., as gate regions of the first and second HEMTs 60, 62. That is, a voltage that is applied to the gate contact 22 may be transmitted to the doped semiconductor layer 30, which causes formation of the 2DEG layer 16 at the heterojunction between the first and second layers 14a, 14b, thereby facilitating conduction of current between the source contact 18 and the drain contact 20.

A second dielectric layer 32 may be provided on the first dielectric layer 28. In some embodiments, as shown in FIG. 1A, a portion of the second dielectric layer 32 may also be provided between the two heterostructures 14. For example, a portion of the second dielectric layer 32 may be provided on the doped semiconductor layer 30 between the two heterostructures 14.

The source contacts 18, the gate contact 22, and the drain contact 20 may be formed of any suitable conductive materials, which in various embodiments may be a metal material. In some embodiments, the source contacts 18 and the gate contact 22 may be formed of a same metal material, which may be patterned to form the separate source contacts 18 and the gate contact 22. As shown in FIG. 1A, the drain contact 20 may be formed on a back side of the substrate 12. In some embodiments, the drain contact 20 may cover a whole region of the back side of the substrate 12 corresponding to a region of the substrate 12 on which the HEMT device 10 is formed. In some embodiments, the drain contact 20 is formed of a metal material that is the same as the metal material used to form the source contacts 18 and the gate contact 22.

As previously discussed, the HEMT device 10 is shown in FIG. 1A as including two HEMTs 60, 62 which share a same gate contact 22. Moreover, the two HEMTs 60, 62 may share the same drain contact 20 in some embodiments. However, each of the HEMTs 60, 62 has its own source contact 18. Moreover, each of the HEMTs 60, 62 has its own heterostructure 14, or its own pair of heterostructures 14. For example, the pair of heterostructures 14 depicted in FIG. 1A are included as part of the first HEMT 60. The second HEMT 62 may similarly include a pair of heterostructures which are the same or substantially the same as shown in FIG. 1A with respect to the first HEMT 60. The heterostructures of the first and second HEMTs 60, 62, as well as the structures or layers positioned between the pairs of heterostructures of the first and second HEMTs 60, 62, may be electrically isolated with respect to one another. Thus, a suitable voltage applied to the shared gate contact 22 may form the 2DEG layer 16 for each of the first and second HEMTs 60, 62; however, signals passed from the source contacts 18 of the first and second HEMTs 60, 62 may be different from one another, and in some embodiments, may be electrically isolated from one another.

FIG. 1B is a cross-sectional view of the HEMT device 10 shown in FIG. 1A, taken along the line 1B-1B. As shown in FIG. 1B, one or more of the HEMTs of the HEMT device 10 (e.g., the HEMT 60) may include multiple pairs of heterostructures 14 that are formed in separate trenches 50 and that are connected to a same source contact 18. More particularly, a plurality of trenches 50 may be formed. The structure within each of the trenches 50 may be the same as shown and described previously herein with respect to FIG. 1A. For example, the structure within each of the trenches 50 may include the feed layer 26, the first layer 14a and the second layer 14b of the heterostructures 14, as well as portions of the first dielectric layer 28, the doped semiconductor layer 30, and the second dielectric layer 32 positioned between the pair of the heterostructures 14 in each trench 50.

During operation of the HEMT device 10, a voltage may be applied to the gate contact 22, which modulates electron mobility within the conduction channels of the HEMT device 10 by forming the 2DEG layers 16. For example, by application of a suitable voltage to the gate contact 22, 2DEG layers 16 may be formed in each of the pair of heterostructures 14 in each of the trenches 50 of the HEMT device 10. Accordingly, a signal or electrical current may be passed from the source contacts 18 to the drain contact 20 through the 2DEG layers 16 of the heterostructures 14.

FIGS. 2-20B are cross-sectional views illustrating a method of fabricating a HEMT device, in accordance with one or more embodiments. The illustrated method may be used, for example, to fabricate the HEMT device 10 shown and described with respect to FIGS. 1A and 1B, although embodiments are not limited thereto.

Figure 2:
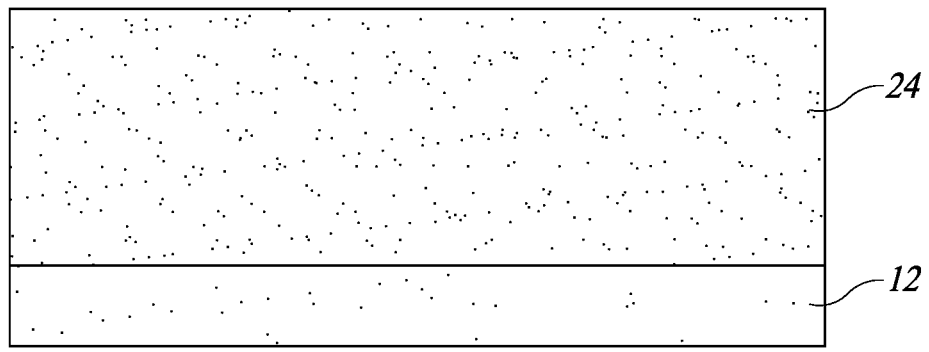
FIGS. 2 through 20B are views illustrating a method of fabricating a HEMT device, in accordance with one or more embodiments of the present disclosure.

As shown in FIG. 2, an epitaxial semiconductor layer 24 is formed on a substrate 12. The substrate 12 may be any semiconductor substrate, and may include, for example, silicon (Si), silicon carbide (SiC), aluminum oxide ($Al_2O_3$) or any other suitable substrate. In some embodiments, the substrate 12 is a silicon (Si) substrate that is doped (e.g., n++ doping) and that has a <100> crystal orientation. However, embodiments of the present disclosure are not limited thereto, and in various embodiments, the substrate 12 may have any crystal orientation different than <111>, for example, a <110> orientation.

The epitaxial semiconductor layer 24 may be formed of a same semiconductor material as the substrate 12. For example, in some embodiments, the epitaxial semiconductor layer 24 may be a layer of epitaxial silicon that is formed on the silicon substrate 12. The epitaxial semiconductor layer 24 may have a crystal orientation different than <111> (e.g., a <100> crystal orientation, or a <110> orientation) in some embodiments, for example, at an upper surface of the epitaxial semiconductor layer 24. The epitaxial semiconductor layer 24 may be formed on the substrate 12, for example, by epitaxial growth of the epitaxial semiconductor layer 24.

Figure 3:
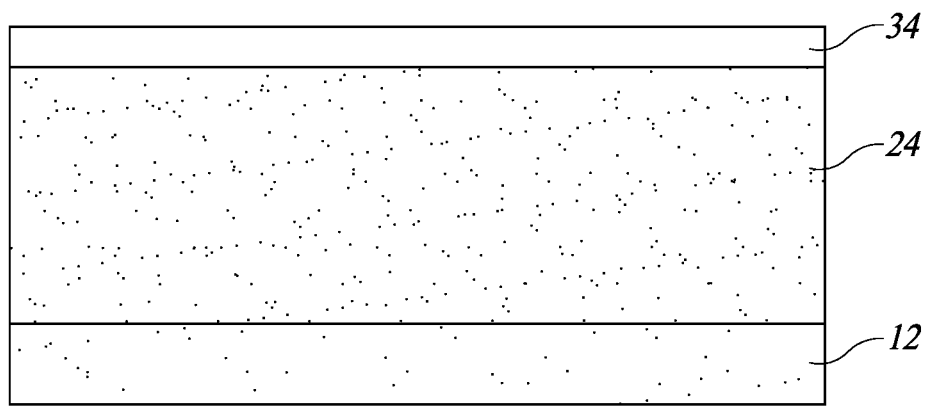

As shown in FIG. 3, an oxide layer 34 is formed on a surface (e.g., the upper surface) of the epitaxial semiconductor layer 24. The oxide layer 34 may be formed by any suitable technique, and in some embodiments, the oxide layer 34 is formed by surface oxidation. The oxide layer 34 may be an oxide of the semiconductor material of the epitaxial semiconductor layer 24. For example, the epitaxial semiconductor layer may be a silicon layer, and the oxide layer 34 may be a silicon oxide.

Figure 4:
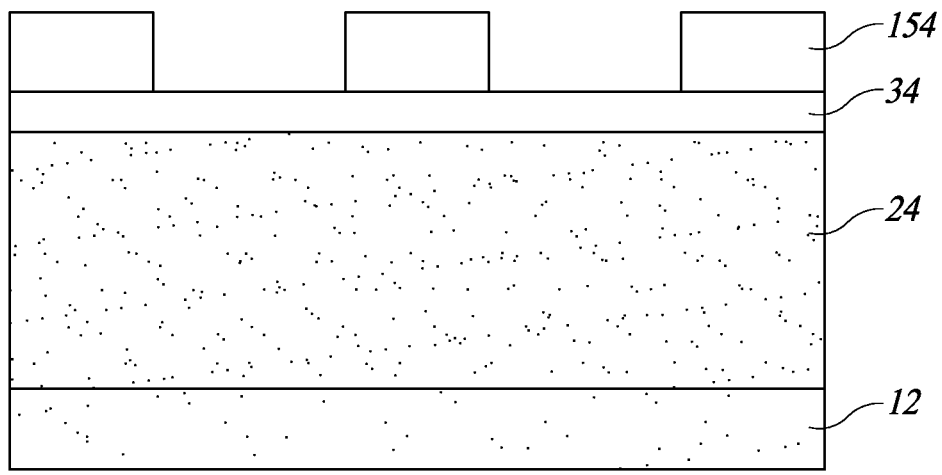

As shown in FIG. 4, a mask 154 is formed on the oxide layer 34. The mask 154 may be any mask suitable for patterning the oxide layer 34, and in some embodiments, the mask 154 may be a photomask or a photoresist, for example, for patterning the oxide layer 34 in a photolithographic process. The mask 154 may be, in some embodiments, any photoresist, such as a negative photoresist or a positive photoresist. The mask 154 may be formed directly on an upper surface of the oxide layer 34 in some embodiments. In some embodiments, the mask 154 may be a hard mask that is resistance to an etch and used to selectively remove portions of the oxide layer 34.

Figure 5:
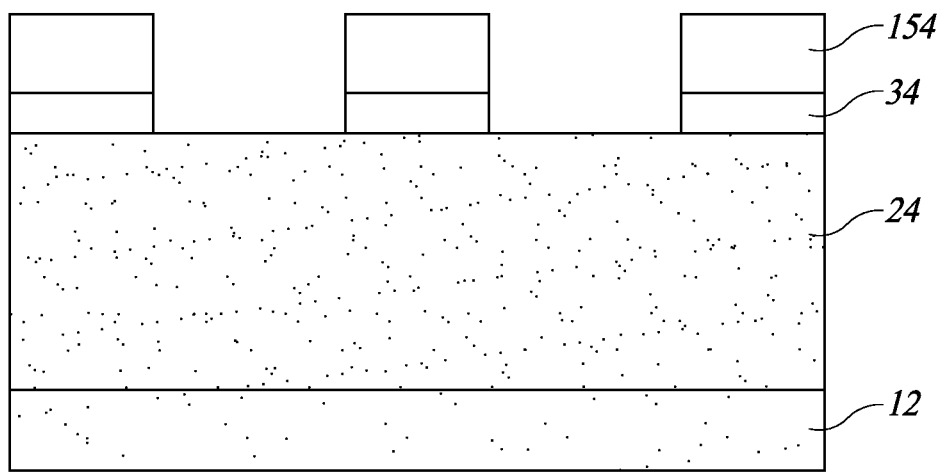

As shown in FIG. 5, portions of the oxide layer 34 are removed, thereby leaving behind regions of the oxide layer 34 as shown in FIG. 5. The portions of the oxide layer 34 may be selectively removed, for example, by any suitable etching process. For example, the structure shown in FIG. 4 may be subjected to an etchant (e.g., an etching gas, plasma, liquid, or the like), and the mask 154 may be resistant to the etchant. Accordingly, the etchant selectively removes only the portions of the oxide layer 34 that are exposed or uncovered by the mask 154.

Figure 6:
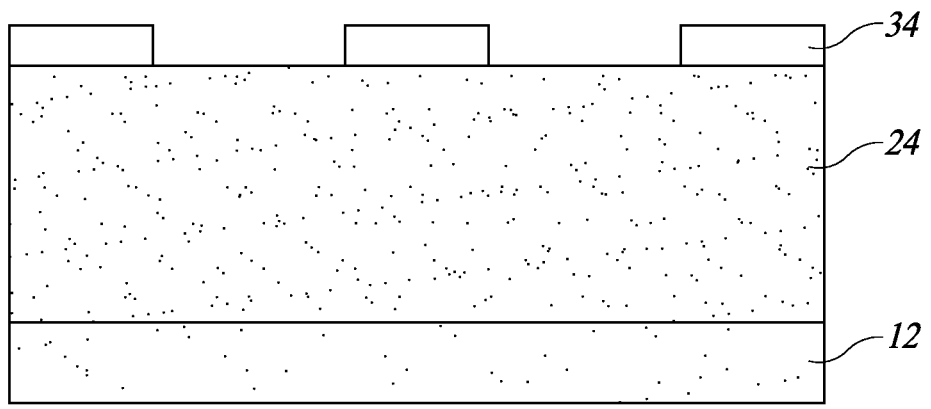

As shown in FIG. 6, the mask 154 may be removed, thereby leaving behind the patterned oxide layer 34 on the surface of the epitaxial semiconductor layer 24. The mask 154 may be removed by any suitable process, including, for example, by use of photoresist stripping materials and processes, such as organic stripping, inorganic stripping, dry stripping, or the like.

Figure 7:
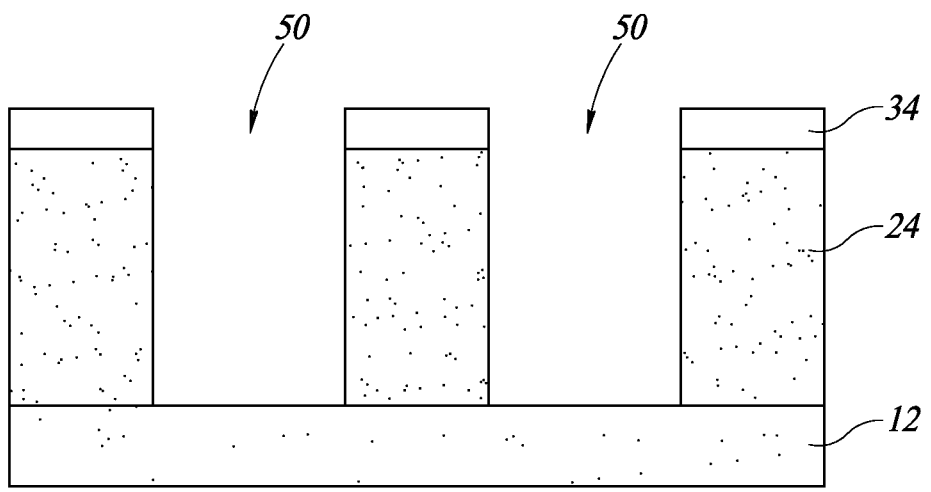

As shown in FIG. 7, the trenches 50 are formed by selectively removing portions of the epitaxial semiconductor layer 24. In some embodiments, the oxide layer 34 acts as a mask during the removal of portions of the epitaxial semiconductor layer 24. The trenches 50 may be formed using any suitable technique for removing the portions of the epitaxial semiconductor layer 24. In some embodiments, the trenches 50 are formed by an etching process, in which the oxide layer 34 acts as a mask that is resistant to the etchant, while the etchant selectively removals the unmasked portions of the epitaxial semiconductor layer 24, thereby forming the trenches 50. The etchant may be any suitable etchant, including, for example, an etching gas, plasma, liquid, or the like.

In some embodiments, the trenches 50 are formed to expose side surfaces of the epitaxial semiconductor layer 24, and the side surfaces of the epitaxial semiconductor layer 24 have a <111> crystal orientation. The exposed sidewalls of the epitaxial semiconductor layer 24 may be formed to have the <111> crystal orientation (e.g., of silicon) by any suitable technique. In some embodiments, the exposed sidewalls of the epitaxial semiconductor layer 24 may be formed to have the <111> crystal orientation by tilting the orientation of the substrate (e.g., the substrate 12 and the epitaxial semiconductor layer 24) during formation of the trenches 50 so that, when the etching is formed, the trenches 50 are formed with the exposed vertical sidewalls of the epitaxial semiconductor layer 24 have the <111> crystal orientation. In some embodiments, the vertical sidewalls of the trenches 50 (i.e., the exposed sidewalls of the epitaxial semiconductor layer 24) are formed at a non-zero angle with respect to a direction orthogonal to the flat of the wafer (e.g., a flat on the substrate 12) on which the epitaxial semiconductor layer 24 is formed. This angle, in some embodiments, may be approximately 19.4° which may result in exposure of the <111> crystal orientation at the sidewalls of the epitaxial semiconductor layer 24.

By forming the HEMT structures (e.g., the feed layer 26 and the heterostructures 14) along sidewalls of the epitaxial semiconductor layer 24 having the <111> crystal orientation, mechanical stresses may be minimized or reduced with respect to such stresses that would be generated if the HEMT structures were formed along semiconductor surfaces having a crystal orientation different than <111>, such as the <100> crystal orientation or the <110> crystal orientation, and the minimized or reduced mechanical stresses may be due to the different thermal coefficients between materials having different crystallographic orientations or reticular pitch. Accordingly, the exposure of epitaxial semiconductor layer 24 sidewalls having the <111> crystal orientation facilitates formation of the HEMT device 10 having advantageously improved qualities, including performance improvements that may be facilitated due to the reduced or minimized mechanical stresses.

Figure 8:
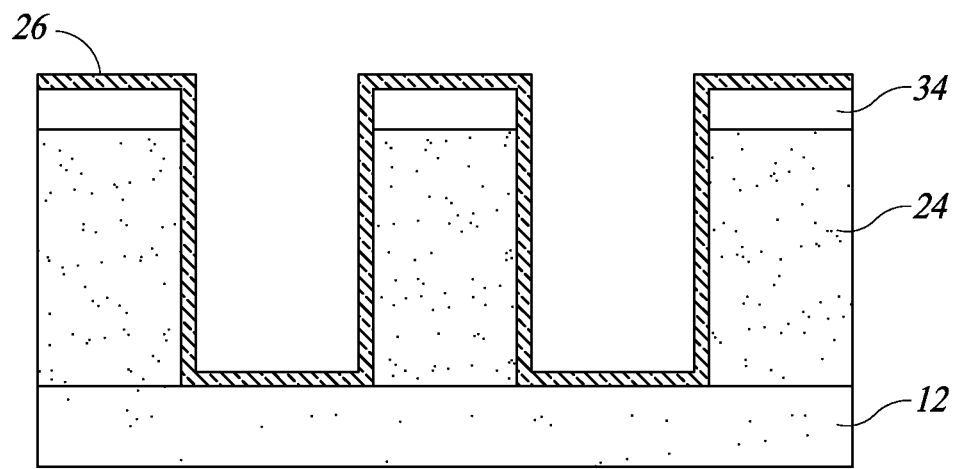

As shown in FIG. 8, a feed layer 26 is formed on the oxide layer 34 and in the trenches 50. The feed layer 26 may be formed by any suitable process, and in some embodiments, the feed layer 26 is formed by deposition of one or more materials constituting the feed layer 26. In some embodiments, the feed layer 26 may be formed by a conformal deposition process in which the feed layer 26 is deposited on all exposed surfaces. In some embodiments, the feed layer 26 is formed on the upper surfaces of the oxide layer 34, side surfaces of the oxide layer 34 and exposed side surfaces of the epitaxial semiconductor layer 24 in the trenches 50, and on upper surfaces of the substrate 12 that are exposed in the trenches 50.

The feed layer 26 may be formed of any suitable material that promotes growth or formation of one or more layers of the heterostructures 14. In some embodiments, the feed layer 26 is a layer of aluminum nitride (AlN).

Figure 9:
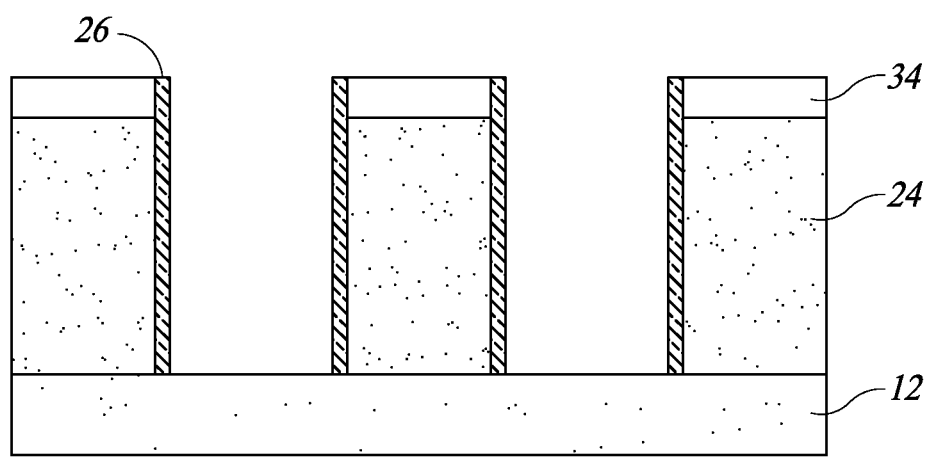

As shown in FIG. 9, portions of the feed layer 26 are selectively removed, so that the feed layer 26 is formed or is retained on substantially only the sidewalls of the epitaxial semiconductor layer 24, and in some embodiments, on the sidewalls of the oxide layer 34 in the trenches 50. The portions of the feed layer 26 may be selectively removed from the upper surfaces of the oxide layer 34 and the surfaces of the substrate 12 which form the lower boundaries of the trenches 50.

The portions of the feed layer 26 may be removed by any suitable technique or process, including, for example, by etching to selectively remove the portions of the feed layer 26. In some embodiments, the portions of the feed layer 26 are removed by dry etching.

Figure 10:
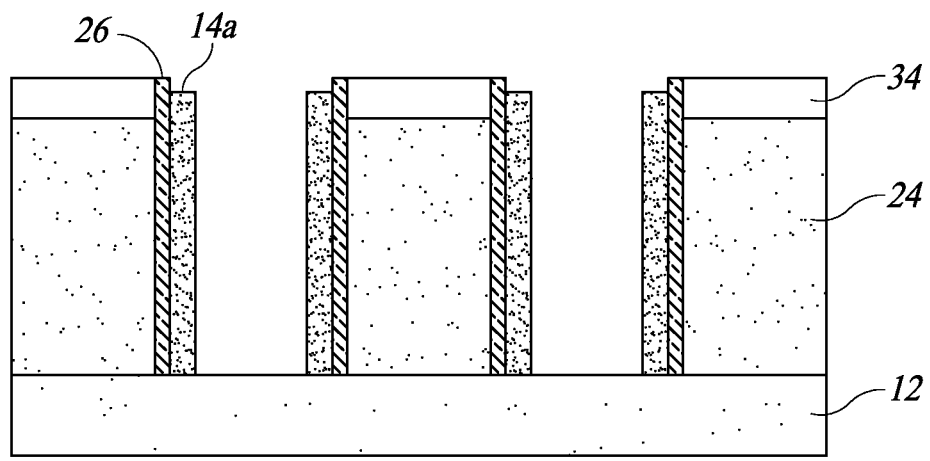

As shown in FIG. 10, the first layer 14a of the heterostructures is formed on side surfaces of the feed layer 26 in the trenches 50. The first layer 14a may include respective portions on side surfaces of each of the portions of the feed layer 26 in the trenches 50. For example, a pair of feed layers 26 may be positioned opposite one another in each of the trenches 50, and a corresponding pair of first layers 14a may be formed on each of the feed layers 26 in each trench 50, and the first layers 14a may be opposite one another in the trench 50.

In some embodiments, the first layer 14a may be formed by growth, such as by epitaxial growth, of the first layer 14a. In some embodiments, the first layer 14a may be an undoped or intrinsic semiconductor material having a narrow energy band gap. In some embodiments, the first layer 14a may be or include a layer of an intrinsic semiconductor, e.g., undoped gallium nitride (GaN).

In various embodiments, the first layer 14a may have an upper surface that recessed with respect to an upper surface of the adjacent oxide layer 34 or the upper surface of the adjacent feed layer 26, for example, as shown in FIG. 10. However, embodiments of the present disclosure are not limited thereto, and in various embodiments, the upper surface of the first layer 14a may be substantially coplanar with, or may extend above, the upper surfaces of the oxide layer 34 or the feed layer 26.

Figure 11:
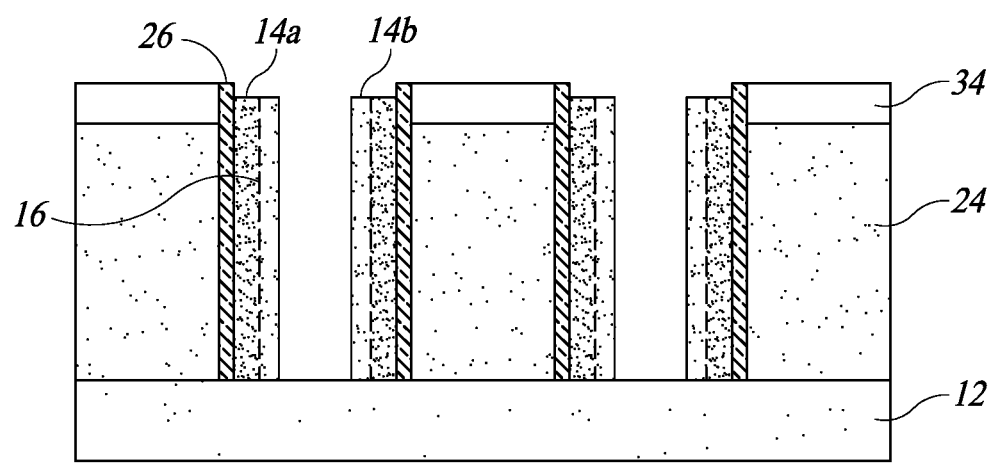

As shown in FIG. 11, the second layer 14b of the heterostructures is formed on side surfaces of the first layer 14a in the trenches 50. The second layer 14b may include respective portions on side surfaces of each of the portions of the first layer 14a in the trenches 50. For example, a pair of second layers 14b may be respectively formed on each of the pair of first layers 14a in each trench 50, and the second layers 14b may be opposite one another in the trench 50.

In some embodiments, the second layer 14b may be formed by growth, such as by epitaxial growth, of the second layer 14b. In some embodiments, the second layer 14b may be doped semiconductor material having a wide energy band gap. In some embodiments, the second layer 14b may be or include a layer of aluminum gallium nitride (AlGaN), which in some embodiments may be negatively-doped (e.g., doped with n-type dopants).

In various embodiments, the second layer 14b may have an upper surface that recessed with respect to an upper surface of the adjacent oxide layer 34 or the upper surface of the adjacent feed layer 26, for example, as shown in FIG. 10. However, embodiments of the present disclosure are not limited thereto, and in various embodiments, the upper surface of the second layer 14b may be substantially coplanar with, or may extend above, the upper surfaces of the oxide layer 34 or the feed layer 26. In some embodiments, the upper surface of the second layer 14b is substantially coplanar with the upper surface of the first layer 14a, as shown.

Figure 12:
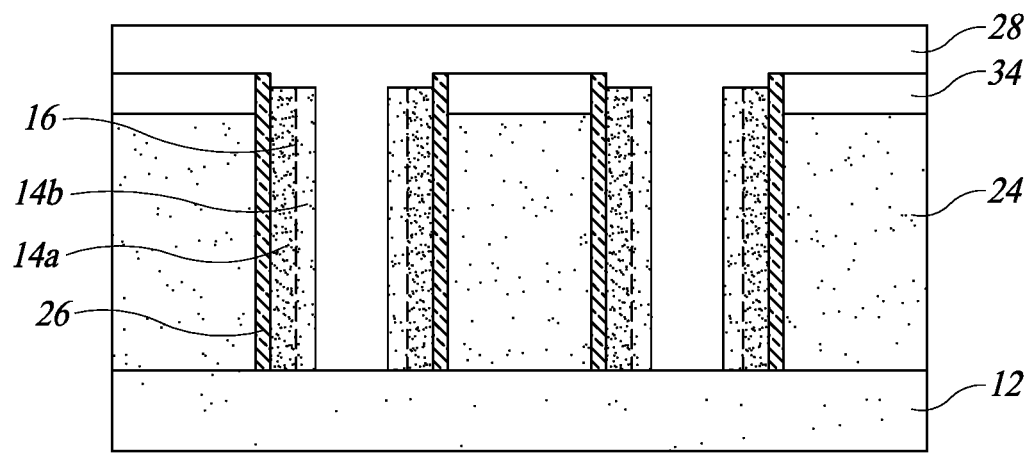

As shown in FIG. 12, a first dielectric layer 28 is formed in the trenches 50 and may cover upper surfaces of the oxide layer 34, the feed layer 26, and the first and second layers 14a, 14b of the heterostructures 14. The first dielectric layer 28 may fill or substantially fill the space in the trenches 50 between respective pairs of the second layers 14b of the heterostructures 14. The first dielectric layer 28 may contact side surfaces of the second layers 14b, as shown.

The first dielectric layer 28 may be formed by any suitable technique or process, including for example by deposition of the first dielectric layer 28. The first dielectric layer 28 may be formed of any dielectric material, and in some embodiments, the first dielectric layer 28 is formed of silicon oxide ($SiO_2$).

Figure 13:
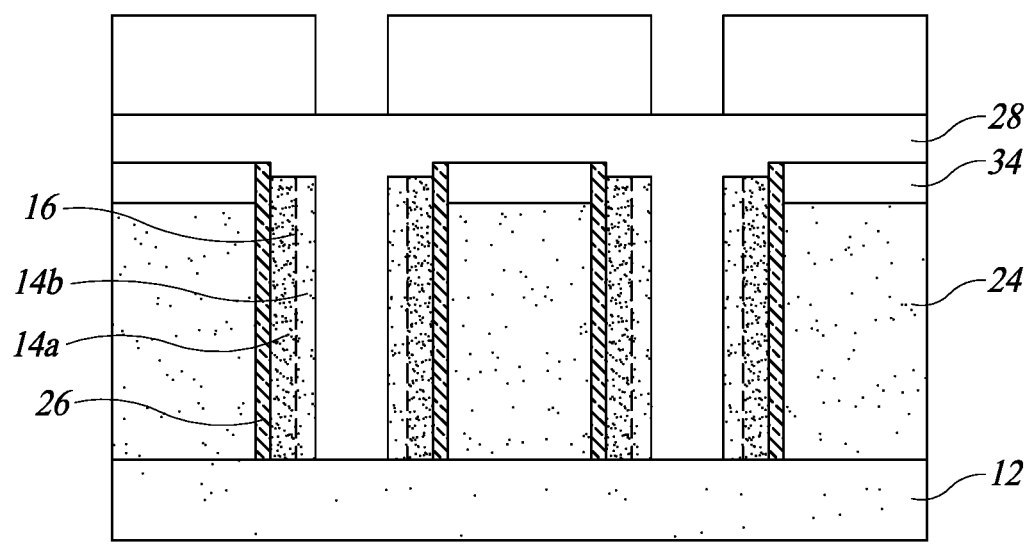

As shown in FIG. 13, a mask 156 is formed on the first dielectric layer 28. The mask 156 may be any mask suitable for patterning the first dielectric layer 28, and in some embodiments, the mask 156 may be a photomask or a photoresist, for example, for patterning the first dielectric layer 28 in a photolithographic process. The mask 156 may be, in some embodiments, any photoresist, such as a negative photoresist or a positive photoresist. The mask 156 may be formed directly on an upper surface of the first dielectric layer 28 in some embodiments, with openings in the mask aligned with or overlying regions of the first dielectric layer 28 filling the trenches 50. In some embodiments, the mask 156 may be a hard mask that is resistance to an etchant used to selectively remove portions of the first dielectric layer 28.

Figure 14A:
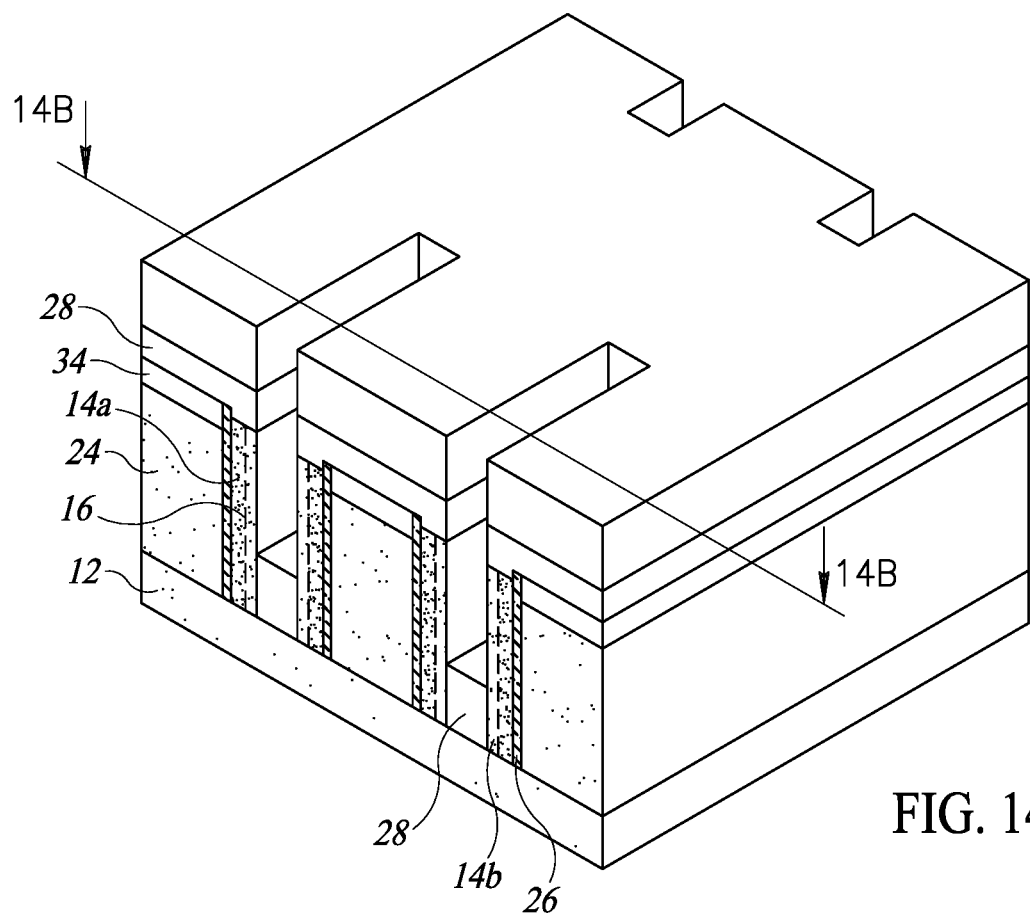
Figure 14B:
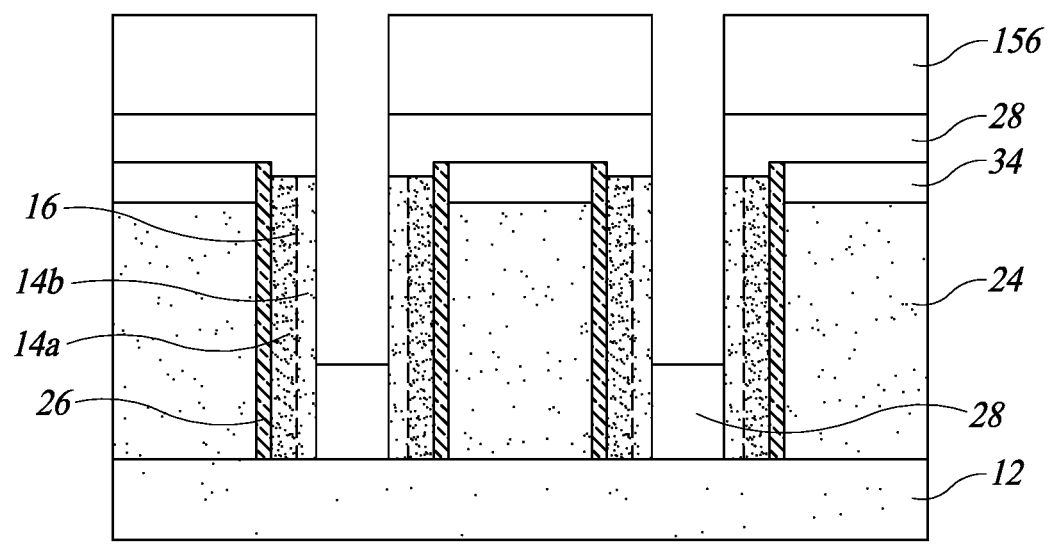

As shown in FIGS. 14A and 14B, portions of the first dielectric layer 28 are removed, thereby leaving behind regions of the first dielectric layer 28, as shown. More particularly, portions of the first dielectric layer 28 are removed from the regions in which the first dielectric layer 28 fills the trenches 50. By removing the portions of the first dielectric layer 28 from the trenches 50, the regions of first dielectric layer 28 within the trenches 50 have a height that is reduced, so that upper surfaces of the first dielectric layer 28 in the trenches 50 are below a level of the upper surfaces of the heterostructures 14.

The portions of the first dielectric layer 28 may be selectively removed, for example, by any suitable etching process. For example, portions of the first dielectric layer 28 that are exposed through openings in the mask 156 may be selectively removed by an etchant (e.g., an etching gas, plasma, liquid, or the like), and the mask 156 may be resistant to the etchant. Accordingly, the etchant selectively removes only the portions of the first dielectric layer 28 that are exposed or uncovered by the mask 156. The etching chemistry, etching time, or other etching parameters may be selected to control the height of the remaining portions of the first dielectric layer 28 within the trenches 50 to a desired level.

Figure 15A:
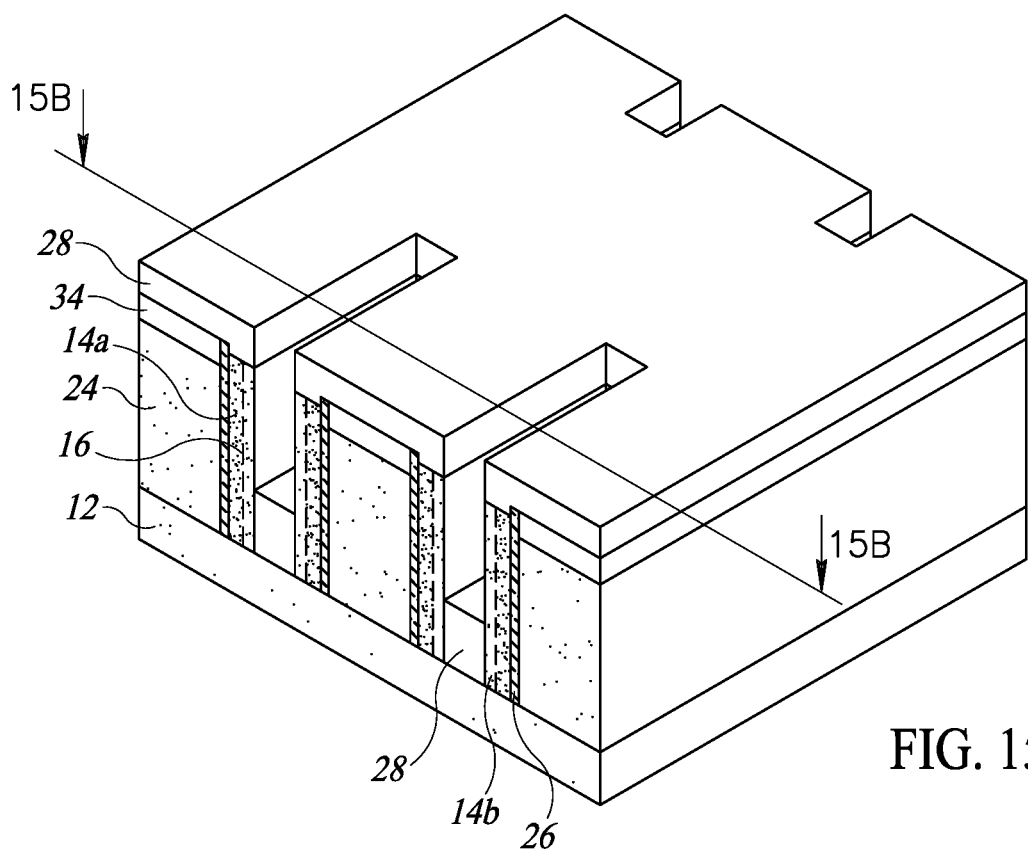
Figure 15B:
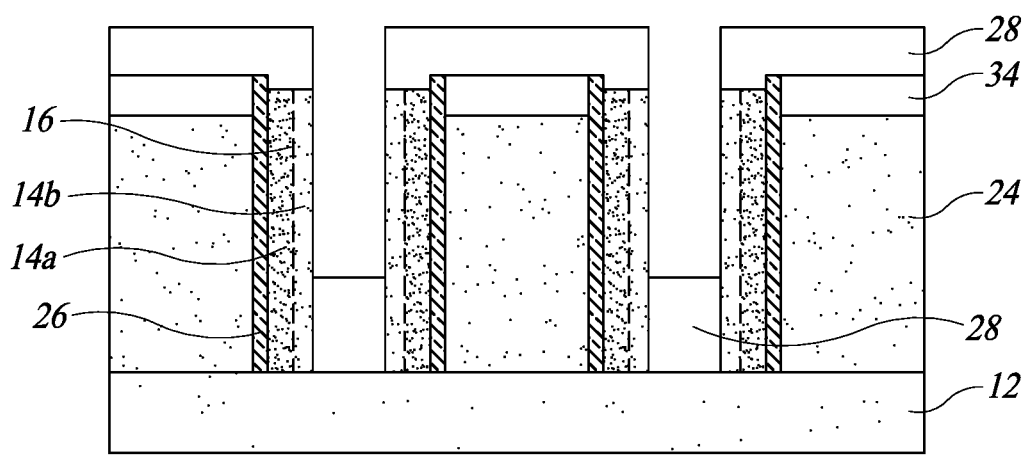

As shown in FIGS. 15A and 15B, the mask 156 may be removed after completion of the etching of the first dielectric layer 28, thereby leaving behind the patterned first dielectric layer 28 on the substrate 12 within the trenches 50, as well as portions of the first dielectric layer 28 on upper surfaces of the oxide layer 34, the feed layer 26, and the heterostructures 14. The mask 156 may be removed by any suitable process, including, for example, by use of photoresist stripping materials and processes, such as organic stripping, inorganic stripping, dry stripping, or the like.

Figure 16A:
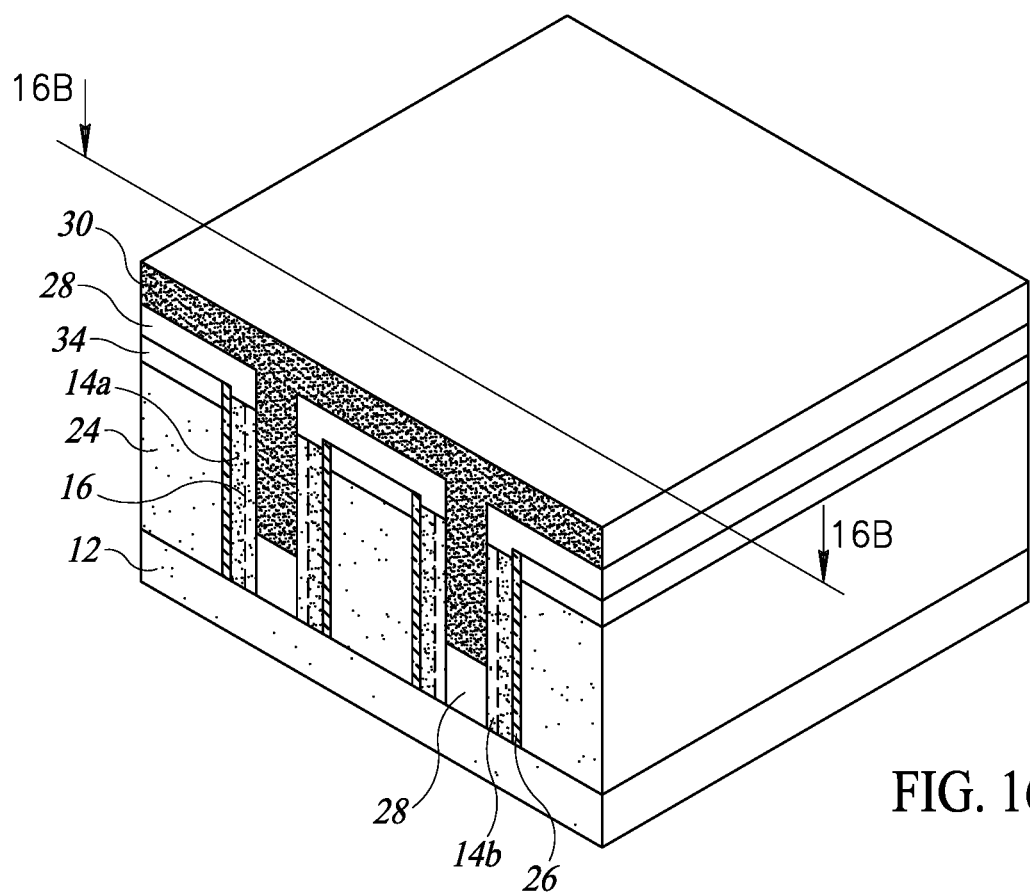
Figure 16B:
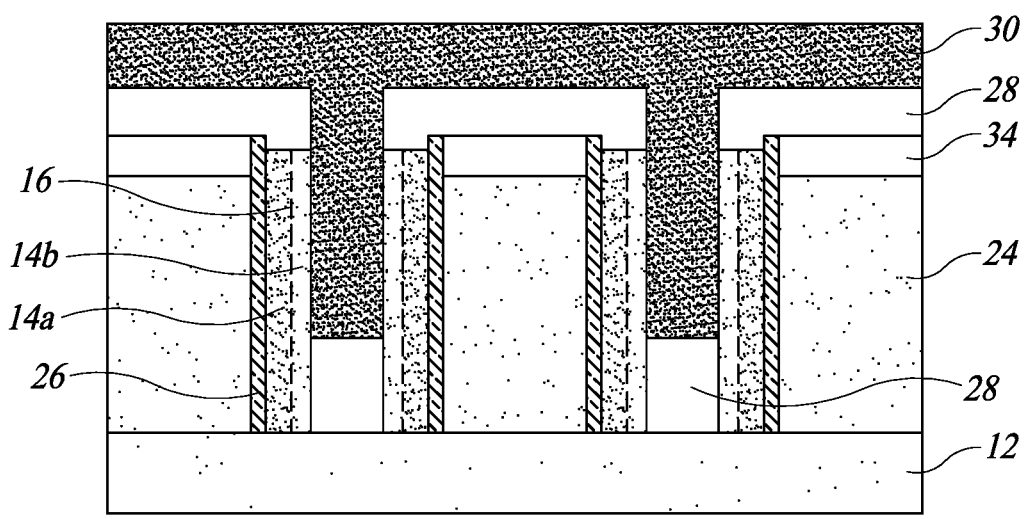

As shown in FIGS. 16A and 16B, a doped semiconductor layer 30 is formed on the surfaces of the first dielectric layer 28 in the trenches 50 and extends between the two heterostructures 14 in each of the trenches 50. The doped semiconductor layer 30 may be formed to fill the trenches 50 over the first dielectric layer 28 and may further cover upper surfaces of the first dielectric layer 28 outside of the trenches 50. The doped semiconductor layer 30 may be formed by any suitable technique or process, including for example by deposition of the doped semiconductor layer 30.

The doped semiconductor layer 30 may be, for example, a positively-doped semiconductor layer having p-type dopants. In some embodiments, the doped semiconductor layer 30 is a GaN layer that is doped with p-type dopants, such as magnesium (Mg). Doping of the doped semiconductor layer 30 may be performed after deposition of a semiconductor material (e.g., by injection of ionized dopants), or in some embodiments, the doped semiconductor layer 30 may be formed, for example, by deposition of semiconductor material including the dopants.

Figure 17A:
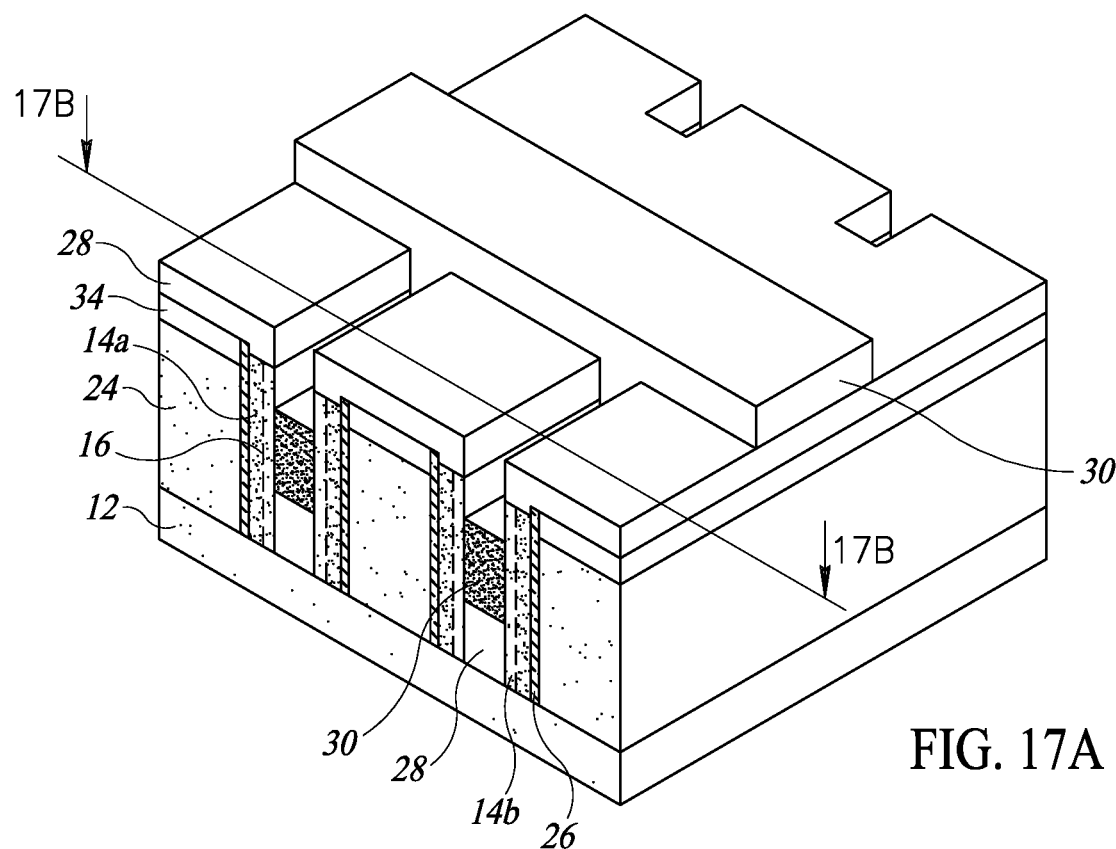
Figure 17B:
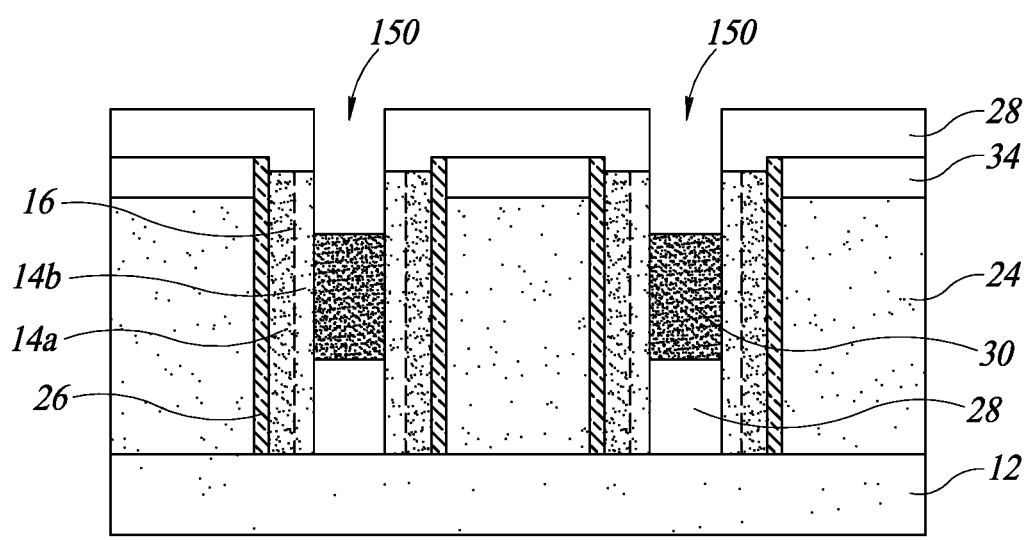

As shown in FIGS. 17A and 17B, the doped semiconductor layer 30 is patterned, for example, by selective removal of portions of the doped semiconductor layer 30. Portions of the doped semiconductor layer 30 may be selectively removed by any suitable process, including for example by any suitable etching process. For example, a masked etching process may be performed in which a mask (not shown) is formed on surfaces of the doped semiconductor layer 30, and an etchant may be applied to etch regions of the doped semiconductor layer 30 that are exposed through openings in the mask.

Recesses 150 are formed in the region of the trenches 50 by the removal of portions of the doped semiconductor layer 30. After patterning of the doped semiconductor layer 30, the doped semiconductor layer 30 may have an upper surface within the trenches 50 that is at a level below that of upper surfaces of the heterostructures 14 and the feed layer 26 in the trenches 50. Further, as can be seen from FIG. 17A, a portion of the doped semiconductor layer 30 extends over the upper surface of the first dielectric layer 28, and this portion of the doped semiconductor layer 30 is connected and electrically coupled to the portions of the doped semiconductor layer 30 that are formed in the trenches 50.

Figure 18A:
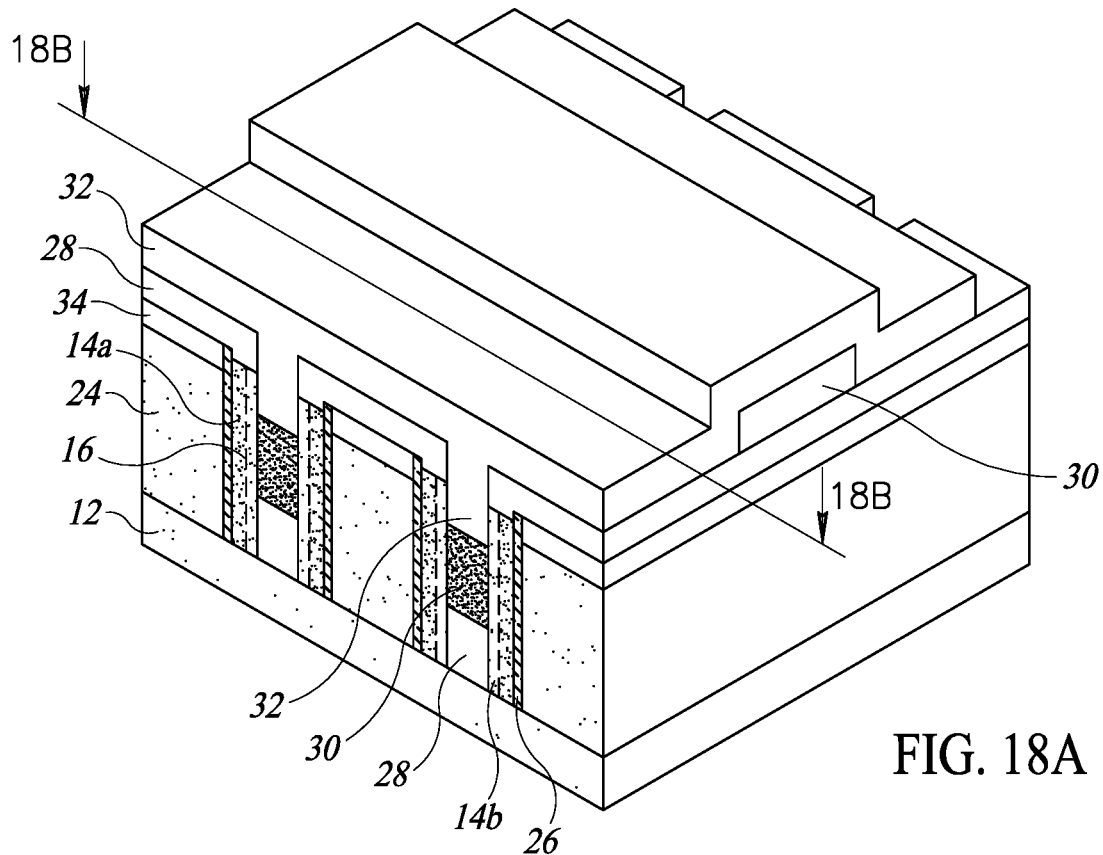
Figure 18B:
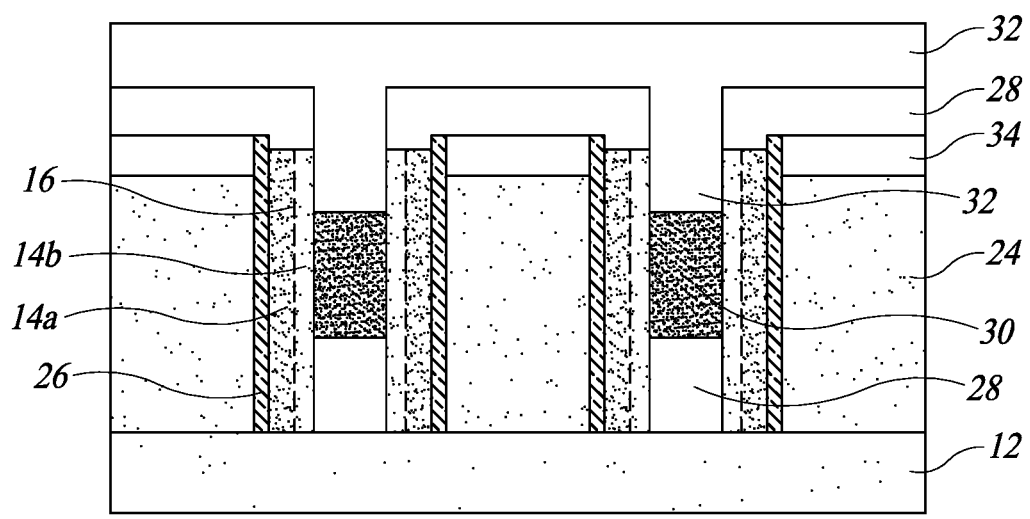

As shown in FIGS. 18A and 18B, a second dielectric layer 32 is formed in the recesses 150 and may cover upper surfaces of the doped semiconductor layer 30 and the first dielectric layer 28. In some embodiments, the second dielectric layer 32 may contact side surfaces of the heterostructures 14 (e.g., the second layer 14b of the heterostructures 14) within the trenches 50.

The second dielectric layer 32 may be formed by any suitable technique or process, including for example by deposition of the second dielectric layer 32. The second dielectric layer 32 may be formed of any dielectric material, and in some embodiments, the second dielectric layer 32 is formed of silicon oxide ($SiO_2$). In some embodiments, the second dielectric layer 32 is formed of a same material as the first dielectric layer 28.

Figure 19A:
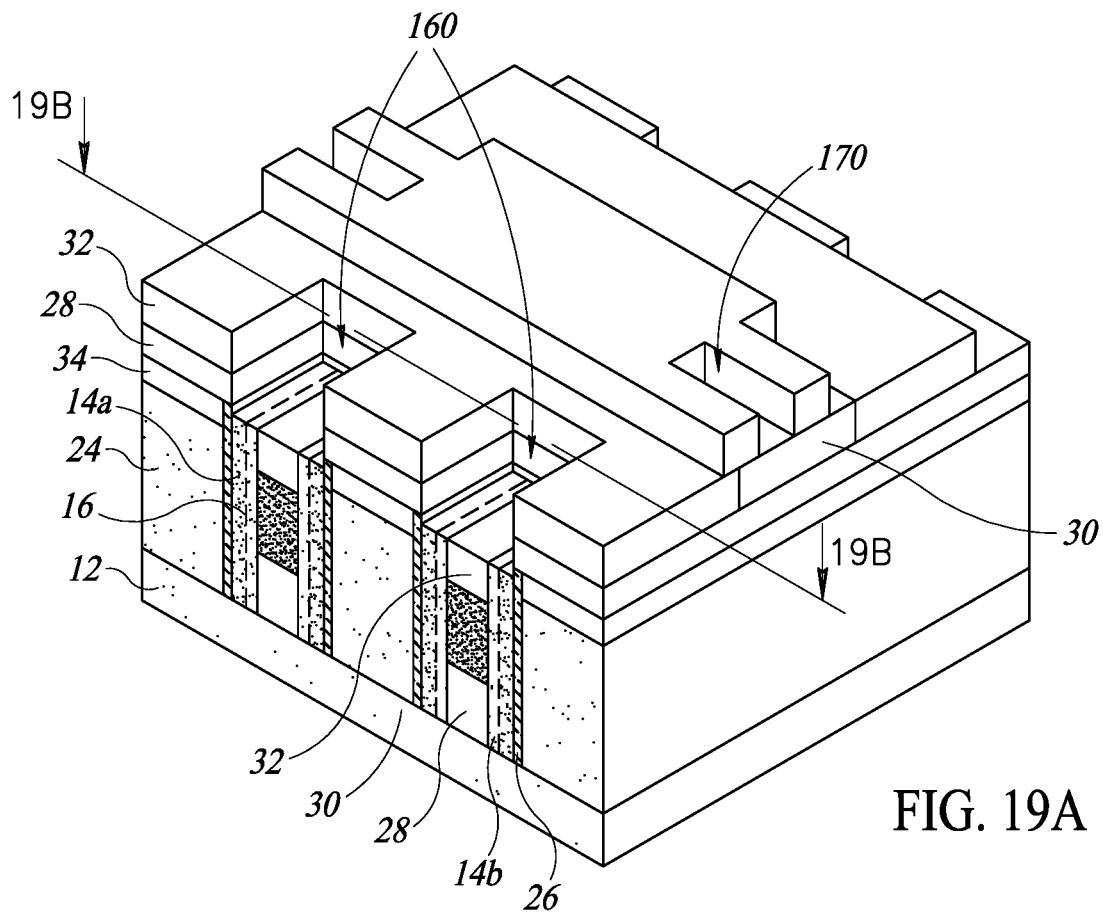
Figure 19B:
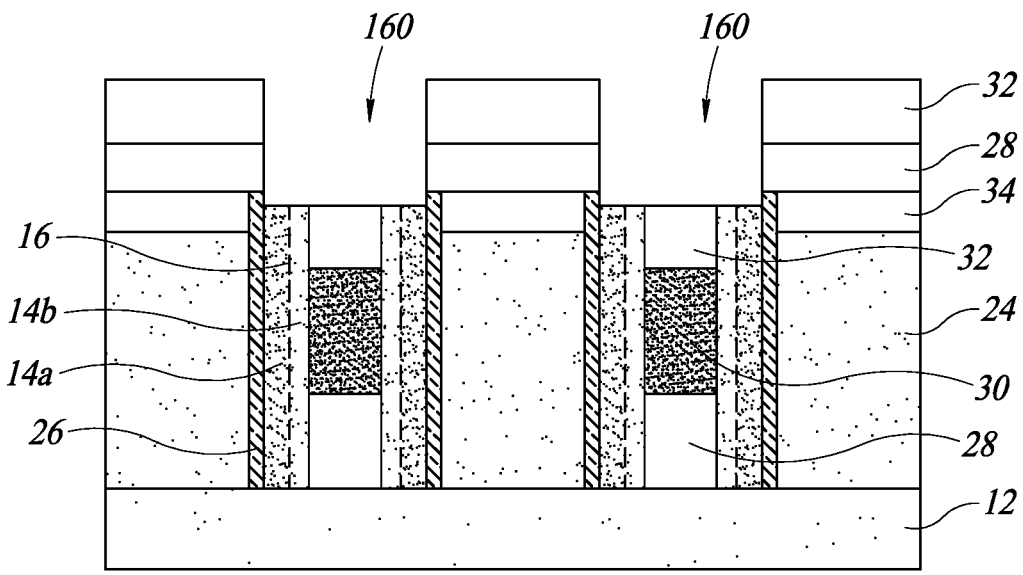

As shown in FIGS. 19A and 19B, source contact regions 160 and gate contact regions 170 are formed by selective removal of portions of the second dielectric layer 32 and the first dielectric layer 28. More particularly, the source contact regions 160 are formed by selectively removing portions of the first and second dielectric layers 28, 32 overlying the heterostructures 14. For example, portions of the first and second dielectric layers 28, 32 may be removed by etching to expose upper surfaces of the heterostructures 14 in the trenches. The second dielectric layer 32 may have an upper surface within the trenches that is substantially coplanar with upper surfaces of the heterostructures 14, as shown. Separate source contact regions 160 may be formed for each of the pairs of heterostructures 14, e.g., each of the source contact regions 160 may expose a respective pair of heterostructures 14 in a respective one of the trenches.

The gate contact regions 170 may be formed by selectively removing (e.g., by etching) portions of the second dielectric layer 32 to expose portions of the doped semiconductor layer 30, as shown in FIG. 19A. In some embodiments, a plurality of gate contact regions 170 are formed, for example, to increase a contact area between the exposed portions of the doped semiconductor layer 30 and the gate contact which is formed by a subsequent process (see FIGS. 20A, 20B).

Figure 20A:
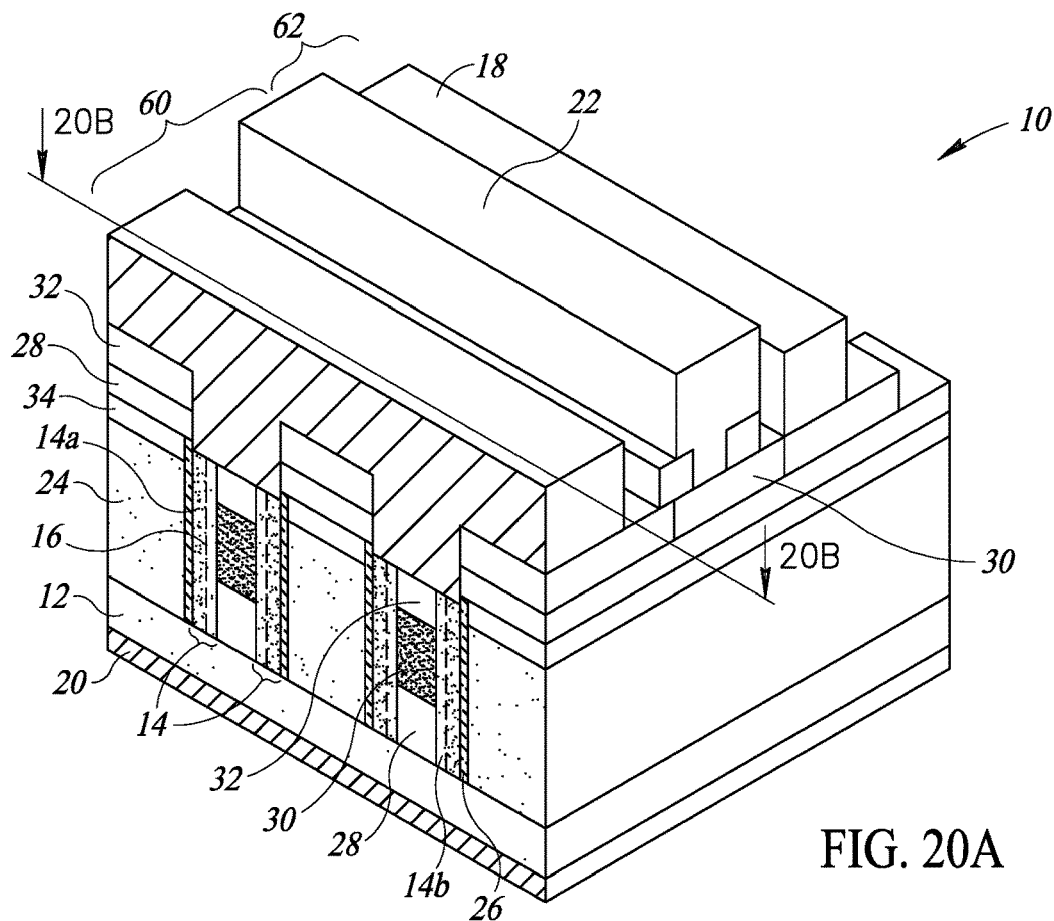
Figure 20B:
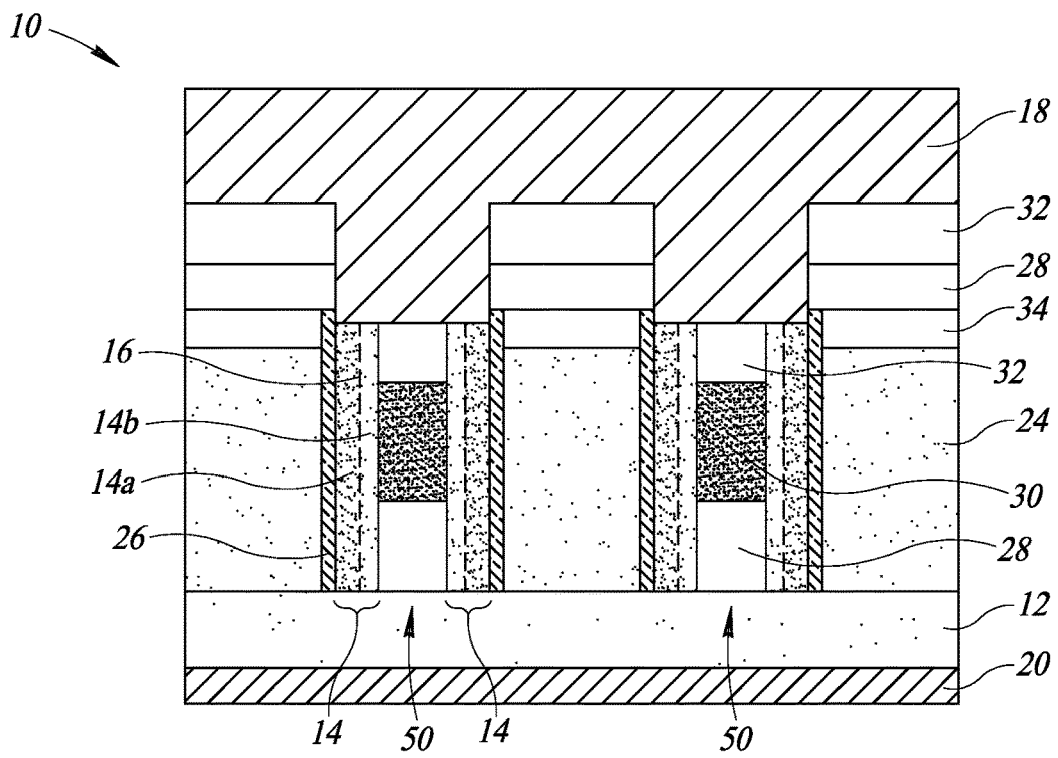

As shown in FIGS. 20A and 20B, a gate contact 22, source contacts 18, and a drain contact 20 are formed. The gate contact 22, source contacts 18, and drain contact 20 may be formed by any suitable technique or process, including for example by deposition and patterning of a conductive material. The source contacts 18, the gate contact 22, and the drain contact 20 may be formed of any suitable conductive materials, which in various embodiments may be a metal material.

In some embodiments, the source contacts 18 and the gate contact 22 may be formed by deposition of a same metal layer, which may be patterned to form the separate source contacts 18 and the gate contact 22. The drain contact 20 may be formed on a back side of the substrate 12, for example, by deposition of a metal material on the back side of the substrate 12. In some embodiments, the drain contact 20 may be formed to cover a whole region of the back side of the substrate 12 corresponding to a region of the substrate 12 on which the HEMT device 10 is formed. In some embodiments, the drain contact 20 is formed of a metal material that is the same as the metal material used to form the source contacts 18 and the gate contact 22.

Formation of the HEMT device 10 is completed upon formation of the source contacts 18, gate contact 22, and drain contact 20, as shown in FIGS. 20A and 20B.

While the method illustrated in FIGS. 2-20B shows the formation of a HEMT device 10 having two HEMTs 60, 62 which share a same gate contact 22, embodiments provided herein are not limited thereto. For example, the method illustrated in FIGS. 2-20B may be utilized to form a HEMT device including any number of HEMTs and as may be desired, depending, for example, on design considerations such as particular desired characteristics of the HEMT device 10. For example, in some embodiments, the HEMT device 10 may include a plurality of gate contacts 22 and a plurality of source contacts 18, with the gate contacts 22 and source contacts 18 alternatively arranged in a comb-like shape.

Moreover, while each of the HEMTs 60, 62 of the HEMT device 10 is shown as having two trenches, each of which includes a respective pair of heterostructures 14, embodiments of the present disclosure are not limited thereto. In various embodiments, the HEMTs of the HEMT device 10 may include a single pair of heterostructures 14 (e.g., as provided in a single trench) or, in some embodiments, may include any number of pairs of heterostructures (e.g., as provided in any corresponding number of trenches). The source contacts 18 may thus be electrically coupled to any number of HEMTs.

Figure 21:
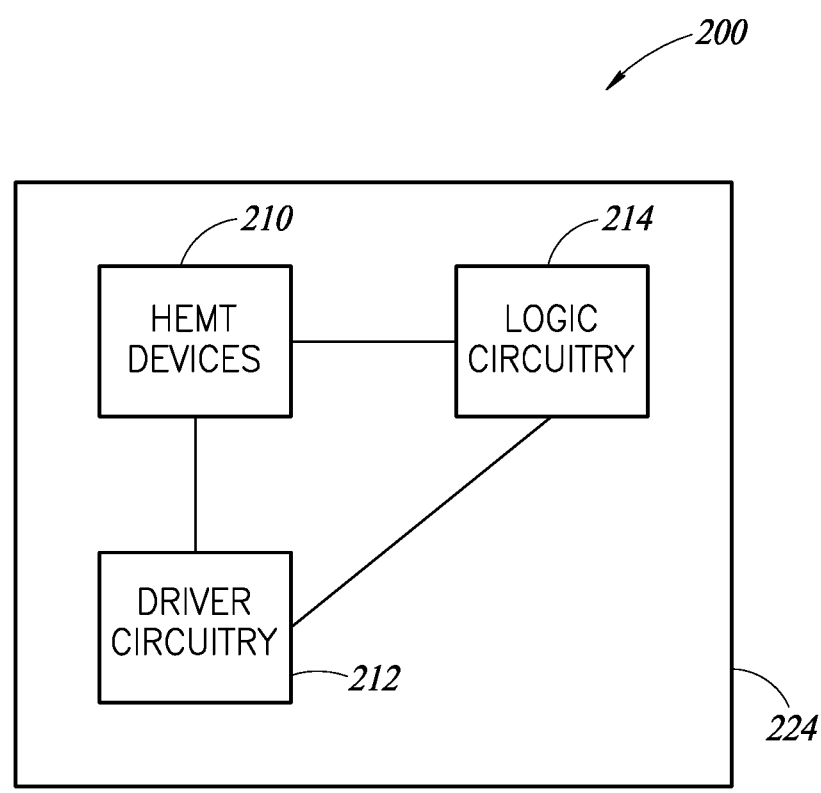
FIG. 21 is a block diagram schematically illustrating an electronic device, in accordance with one or more embodiments of the present disclosure.

FIG. 21 is a block diagram schematically illustrating an electronic device 200. The electronic device 200 may be a semiconductor die having a plurality of electrical circuitry, components, features or the like formed on a same substrate 224. The substrate 224 may be, for example, a silicon substrate. In some embodiments, the substrate 224 includes the substrate 12 and the epitaxial semiconductor layer 24 as previously described herein.

The electronic device 200 includes at least one HEMT device 210, which may be the same or substantially the same as the HEMT device 10 previously described herein. In some embodiments, a plurality of HEMT devices 210 is formed on the substrate 224 of the electronic device 200.

The electronic device 200 may further include driver circuitry 212 and logic circuitry 214. The driver circuitry 212 and the logic circuitry 214 may each include a plurality of electrical circuitry, components, features or the like which are formed on or in the same substrate 224 (e.g., the silicon substrate) on or in which the HEMT devices 210 are formed. In some embodiments, the driver circuitry 212 and the logic circuitry 214 includes a plurality of electrical devices, such as transistors, which are formed by conventional technologies in silicon, including, for example, Complementary Metal Oxide Semiconductor (CMOS) processes, Double Diffused Metal Oxide Semiconductor (DMOS) processes, Bipolar-CMOS-DMOS (BCD) processes, or the like. For example, the driver circuitry 212 and the logic circuitry 214 may include a plurality of CMOS transistors. Such electrical devices in the driver circuitry 212 and the logic circuitry 214 traditionally are not formed on a same substrate as HEMT devices, since conventional HEMT devices (such as conventional GaN HEMT devices) typically are formed on specialized silicon substrates having a <111> crystal orientation, while driver circuitry 212, logic circuitry 214, or other circuitry electrically coupled to the HEMT devices are typically formed on a silicon substrate having a crystal orientation different than <111> (e.g., a <100> crystal orientation, or a <110> crystal orientation) due to the lower mobility of carriers.

However, in embodiments provided herein, the HEMT devices 210 may be formed on a silicon substrate having a crystal orientation different than <111> (e.g., the <100> crystal orientation, or a <110> crystal orientation), due to the structure and processes of forming the HEMT devices as described herein. This facilitates inclusion of the driver circuitry 212, logic circuitry 214, as well as various other circuitry or electrical components on a same silicon substrate, or on a same semiconductor die, as the HEMT devices 210. By including the driver circuitry 212 and the logic circuitry 214 on a same die as the HEMT devices 210, the electronic device 200 facilitates significant advantages in the way of increased speed and reduced stray inductance as compared to electronic devices in which driver circuitry and logic circuitry is formed on a separate die as the HEMT devices. Electronic devices in which driver circuitry and logic circuitry is formed on a separate die as the HEMT devices suffer from reduced speed and increased stray inductance due to wires, solder bumpers, or the like that provide electrical connection between the die on which the HEMT devices are formed and the separate die on which the driver circuitry and logic circuitry is formed. Accordingly, forming the HEMT devices 210, the driver circuitry 212, and the logic circuitry 214 on a same substrate 224 (e.g., on a same silicon die), embodiments provided herein facilitate significant advantages in the way of increased speed and reduced stray inductance, since such wires or solder bumpers are not needed to electrically connect separate dies.

In some embodiments, the electronic device 200 may be a DC/DC converter. However, embodiments of the present disclosure are not limited thereto, and in various embodiments, the electronic device 200 may be any electronic device including one or more HEMT devices 210 and one or more electrical components, features or the like that are formed in or on a same substrate 224.

The various embodiments described herein can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high electron mobility transistor (HEMT), comprising:
   a substrate having a first surface, the substrate being a silicon substrate;
   an epitaxial semiconductor layer on the first surface of the substrate, the epitaxial semiconductor layer being an epitaxial silicon layer;
   a first heterostructure and a second heterostructure on the substrate and facing each another,
      each of the first and second heterostructures including a first semiconductor layer on the first surface of the substrate, a second semiconductor layer on the first surface of the substrate, and a two-dimensional electrode gas (2DEG) layer between the first and second semiconductor layers, the first semiconductor layer of each of the first and second heterostructures being on a respective side surface of the epitaxial semiconductor layer;
a doped semiconductor layer between the first and second heterostructures; and
a source contact on the first heterostructure and the second heterostructure.

2. The HEMT of claim 1 wherein the source contact directly contacts surfaces of the first semiconductor layer and the second semiconductor layer of each of the first heterostructure and the second heterostructure.

3. The HEMT of claim 2 wherein a surface of the second semiconductor layer is substantially coplanar with surfaces of the first and second heterostructures.

4. The HEMT of claim 1 wherein the first semiconductor layer of the first and second heterostructures includes gallium nitride (GaN), and the second semiconductor layer of the first and second heterostructures includes aluminum gallium nitride (AlGaN).

5. The HEMT of claim 4 wherein the doped semiconductor layer includes gallium nitride (GaN) doped with p-type dopants.

6. The HEMT of claim 5, further comprising:
a first dielectric layer including a portion on the first surface of the substrate between the first and second heterostructures, the doped semiconductor layer on the portion of the first dielectric layer; and
a second dielectric layer on the doped semiconductor layer.

7. The HEMT device of claim 1 wherein the epitaxial semiconductor layer has a crystal orientation at an upper surface thereof that is different than <111>, and the epitaxial semiconductor layer has a <111> crystal orientation at the side surfaces of the epitaxial semiconductor layer.

8. The HEMT device of claim 1 further comprising a feed layer on the side surfaces of the epitaxial semiconductor layer, the feed layer disposed between the side surfaces of the epitaxial semiconductor layer and the first semiconductor layer of the first and second heterostructures.

9. The HEMT device of claim 8 wherein the feed layer comprises aluminum nitride.

10. The HEMT of claim 1, further comprising a gate contact on the doped semiconductor layer.

11. The HEMT of claim 10, further comprising a drain contact on a second surface of the substrate that is opposite the first surface.

12. The HEMT device of claim 1, further comprising:
a third heterostructure and a fourth heterostructure on the substrate and facing one another, each of the third and fourth heterostructures including the first semiconductor layer on the first surface of the substrate, the second semiconductor layer on the first surface of the substrate, and a two-dimensional electrode gas (2DEG) layer between the first and second semiconductor layers, the third and fourth heterostructures spaced laterally apart from the first and second heterostructures,
wherein the doped semiconductor layer extends between the third and fourth heterostructures, and the source contact is electrically coupled to the first heterostructure, the second heterostructure, the third heterostructure, and the fourth heterostructure.

13. An electronic device, comprising:
a silicon substrate having a first surface; and
a high electron mobility transistor (HEMT) on the silicon substrate, the HEMT including:
a first heterostructure and a second heterostructure on the first surface of the silicon substrate and facing one another, each of the first and second heterostructures including a first semiconductor layer on the first surface of the silicon substrate, a second semiconductor layer on the first surface of the silicon substrate, and a two-dimensional electrode gas (2DEG) layer between the first and second semiconductor layers;
a first dielectric layer including a portion on the first surface of the silicon substrate between the first and second heterostructures;
a doped semiconductor layer on the portion of the first dielectric layer between the first and second heterostructures;
a second dielectric layer including a portion on the doped semiconductor layer between the first and second heterostructures;
a source contact on the first heterostructure and the second heterostructure;
a gate contact on the doped semiconductor layer; and
a drain contact on a second surface of the silicon substrate opposite the first surface.

14. The electronic device of claim 13, further comprising: driving circuitry on the silicon substrate, the driving circuitry electrically coupled to the HEMT.

15. The electronic device of claim 13 wherein the first semiconductor layer of the first and second heterostructures includes undoped gallium nitride (GaN), the second semiconductor layer of the first and second heterostructures includes aluminum gallium nitride (AlGaN), and the doped semiconductor layer includes gallium nitride (GaN) doped with p-type dopants.

16. The electronic device of claim 14 wherein the driving circuitry includes a plurality of Complementary Metal Oxide Semiconductor (CMOS) transistors.

17. A high electron mobility transistor (HEMT), comprising:
a substrate having a first surface;
an epitaxial semiconductor layer on the first surface of the substrate;
a first heterostructure and a second heterostructure on the substrate and facing each another,
each of the first and second heterostructures including a first semiconductor layer on the first surface of the substrate, a second semiconductor layer on the first surface of the substrate, and a two-dimensional electrode gas (2DEG) layer between the first and second semiconductor layers,
the first semiconductor layer of each of the first and second heterostructures being on a respective side surface of the epitaxial semiconductor layer;
a feed layer on side surfaces of the epitaxial semiconductor layer, the feed layer disposed between the side surfaces of the epitaxial semiconductor layer and the first semiconductor layer of the first and second heterostructures;
a doped semiconductor layer between the first and second heterostructures; and
a source contact on the first heterostructure and the second heterostructure.

18. The HEMT of claim 17 wherein the source contact directly contacts surfaces of the first semiconductor layer and the second semiconductor layer of each of the first heterostructure and the second heterostructure.

19. The HEMT of claim 18 wherein a surface of the second semiconductor layer is substantially coplanar with surfaces of the first and second heterostructures.

* * * * *